(12) United States Patent
Lin

(10) Patent No.: US 9,515,241 B2
(45) Date of Patent: Dec. 6, 2016

(54) LED STRUCTURE, METALLIC FRAME OF LED STRUCTURE, AND CARRIER MODULE

(71) Applicants: LITE-ON OPTO TECHNOLOGY (CHANGZHOU) CO., LTD., Changzhou, Jiangsu Province (CN); LITE-ON TECHNOLOGY CORPORATION, Taipei (TW)

(72) Inventor: Chen-Hsiu Lin, New Taipei (TW)

(73) Assignees: LITE-ON OPTO TECHNOLOGY (CHANGZHOU) CO., LTD., Changzhou, Jiangsu Province (CN); LITE-ON TECHNOLOGY CORPORATION, Taipei (TW)

( * ) Notice: Subject to any disclaimer, the term of this patent is extended or adjusted under 35 U.S.C. 154(b) by 39 days.

(21) Appl. No.: 14/309,989

(22) Filed: Jun. 20, 2014

(65) Prior Publication Data
US 2015/0014722 A1 Jan. 15, 2015

Related U.S. Application Data

(60) Provisional application No. 61/845,526, filed on Jul. 12, 2013.

(51) Int. Cl.
| | |
|---|---|
| *H01L 33/62* | (2010.01) |
| *F21V 19/00* | (2006.01) |
| *H01L 33/60* | (2010.01) |
| *H01L 23/00* | (2006.01) |
| *H01L 25/075* | (2006.01) |
| *H01L 33/48* | (2010.01) |

(52) U.S. Cl.
CPC ............. *H01L 33/62* (2013.01); *F21V 19/001* (2013.01); *H01L 24/97* (2013.01); *H01L 33/483* (2013.01); *H01L 33/60* (2013.01); *H01L 25/0753* (2013.01); *H01L 33/486* (2013.01); *H01L 2224/48091* (2013.01); *H01L 2224/48247* (2013.01); *H01L 2224/48257* (2013.01); *H01L 2933/0033* (2013.01); *H01L 2933/0066* (2013.01)

(58) Field of Classification Search
CPC ..... H01L 27/15; H01L 33/641; H01L 33/62; H01L 33/50; H01L 33/54; H01L 33/486; H01L 33/60; H01L 33/483; H01L 2924/10157; H01L 2224/32245; H01L 2224/48091; H01L 2224/48257; H01L 2224/48247; H01L 2933/0091; H01L 2933/0066; H01L 2933/0033; H01L 24/97; H01L 25/0753
See application file for complete search history.

(56) References Cited

U.S. PATENT DOCUMENTS

| | | | |
|---|---|---|---|
| 2010/0163918 A1* | 7/2010 | Kim .................... | H01L 25/0753 257/99 |
| 2012/0313131 A1* | 12/2012 | Oda et al. ........................ | 257/98 |
| 2013/0062613 A1* | 3/2013 | Takeshita et al. .............. | 257/76 |
| 2013/0221509 A1* | 8/2013 | Oda et al. ...................... | 257/676 |

* cited by examiner

*Primary Examiner* — Lauren R Bell
(74) *Attorney, Agent, or Firm* — Li & Cai Intellectual Property (USA) Office

(57) ABSTRACT

A metallic frame of an LED structure includes two conductive frames spaced apart from each other with a gap and a plurality of extending arms respectively and integrally extended from the conductive frames. Each conductive frame includes a top surface, a bottom surface, and a lateral surface connecting the top and bottom surfaces. Each top surface comprises a sealed region and a mounting region surrounded by the sealed region, and the sealed and mounting regions of each conductive frame are defined by an insulating body. Each conductive frame has at least one slot concavely formed on the sealed region, and the lateral surface is formed with two openings and the slot is communicated with the two openings, such that the slot of each of the conductive frames is configured to separate at least one of the extending arms from the mounting region of the conductive frames.

14 Claims, 19 Drawing Sheets

US 9,515,241 B2

LED STRUCTURE, METALLIC FRAME OF LED STRUCTURE, AND CARRIER MODULE

BACKGROUND OF THE INVENTION

1. Field of the Invention

The instant disclosure relates to a light-emitting structure; and more particularly to an LED structure for providing a plurality of LED chips to be mounted thereon. The instant disclosure also relates to a metallic frame of an LED structure and a carrier module thereof.

2. Description of Related Art

With the development of high-efficiency and high-power LEDs, an insulating body for sealing the conductive frame made of a thermoplastic material has gradually been replaced by a thermosetting material. However, the combination strength between the conductive frame and the insulating body is too weak and results in several problems, such as mist permeation.

SUMMARY OF THE INVENTION

As mentioned above, an LED structure, a metallic frame of an LED structure, and a carrier module are provided in the instant disclosure. At least one slot is formed on the sealed region of the conductive frame (e.g., the slot is formed on the corner of the conductive frame and is communicated with the adjacent lateral surfaces, or the slot is formed with a U-shaped groove and surrounds the mounting region of the conductive frame) so as to improve the combination strength of the metallic frame and the insulating body. Therefore, the possibility of mist permeation can be reduced.

In summary, the LED structure, the metallic frame of the LED structure and the carrier module are provided by the instant disclosure. By forming at least one slot on the metallic frame, the combination strength between the insulating body and the top surface of the metallic frame is improved. Moreover, the mist, which usually permeates into the mounting region along the extending arms, can be effectively blocked by means of the combination strength between the insulating body and the slot on the metallic frame. Therefore, the possibility of mist permeation can be effectively reduced by the distribution of the slots.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

First Embodiment

Figure 1:
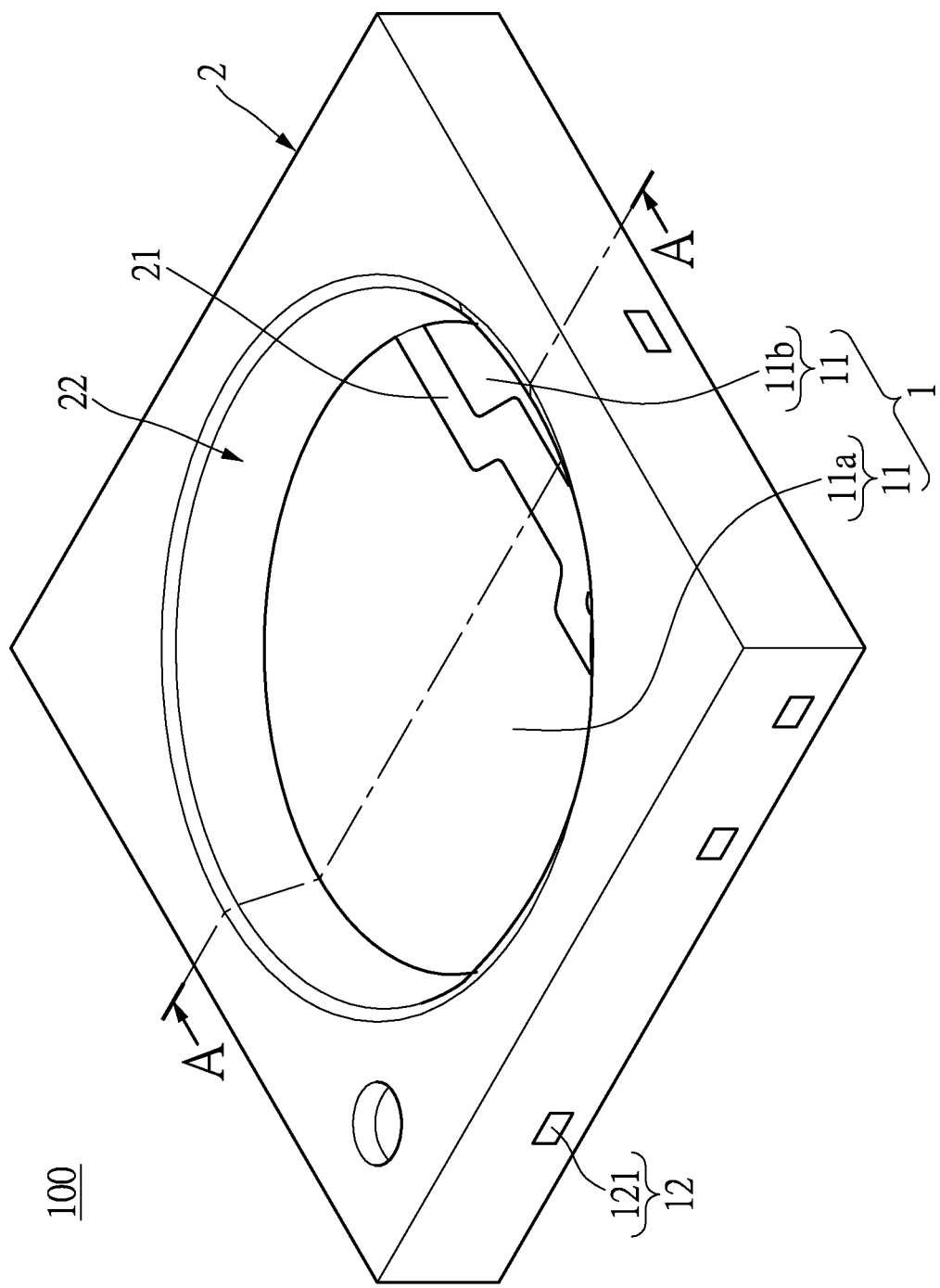
FIG. 1 is a perspective view of a carrier according to a first embodiment of the instant disclosure.
Figure 2:
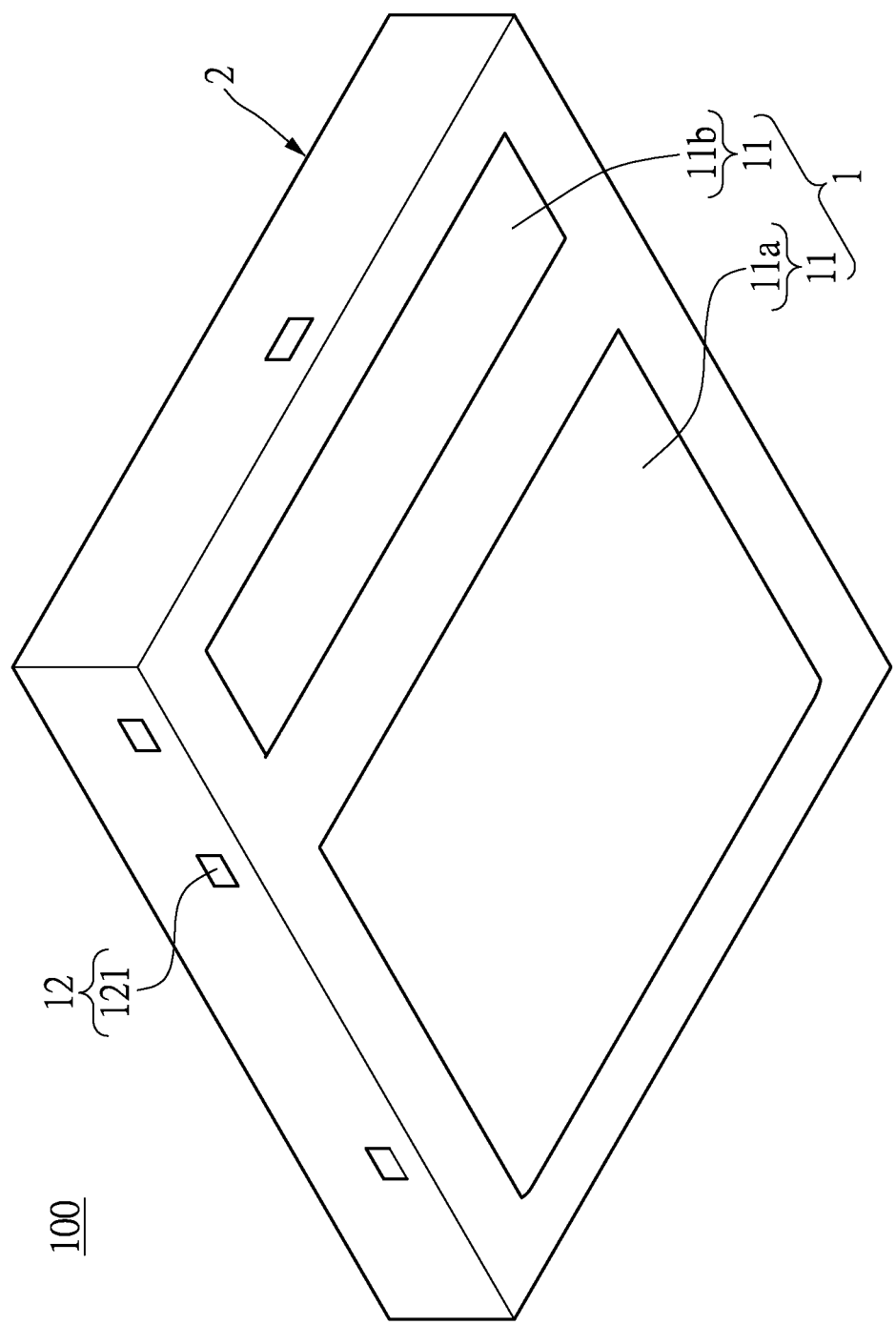
FIG. 2 is a perspective view of the carrier in another viewing angle with respective to FIG. 1.
Figure 3:
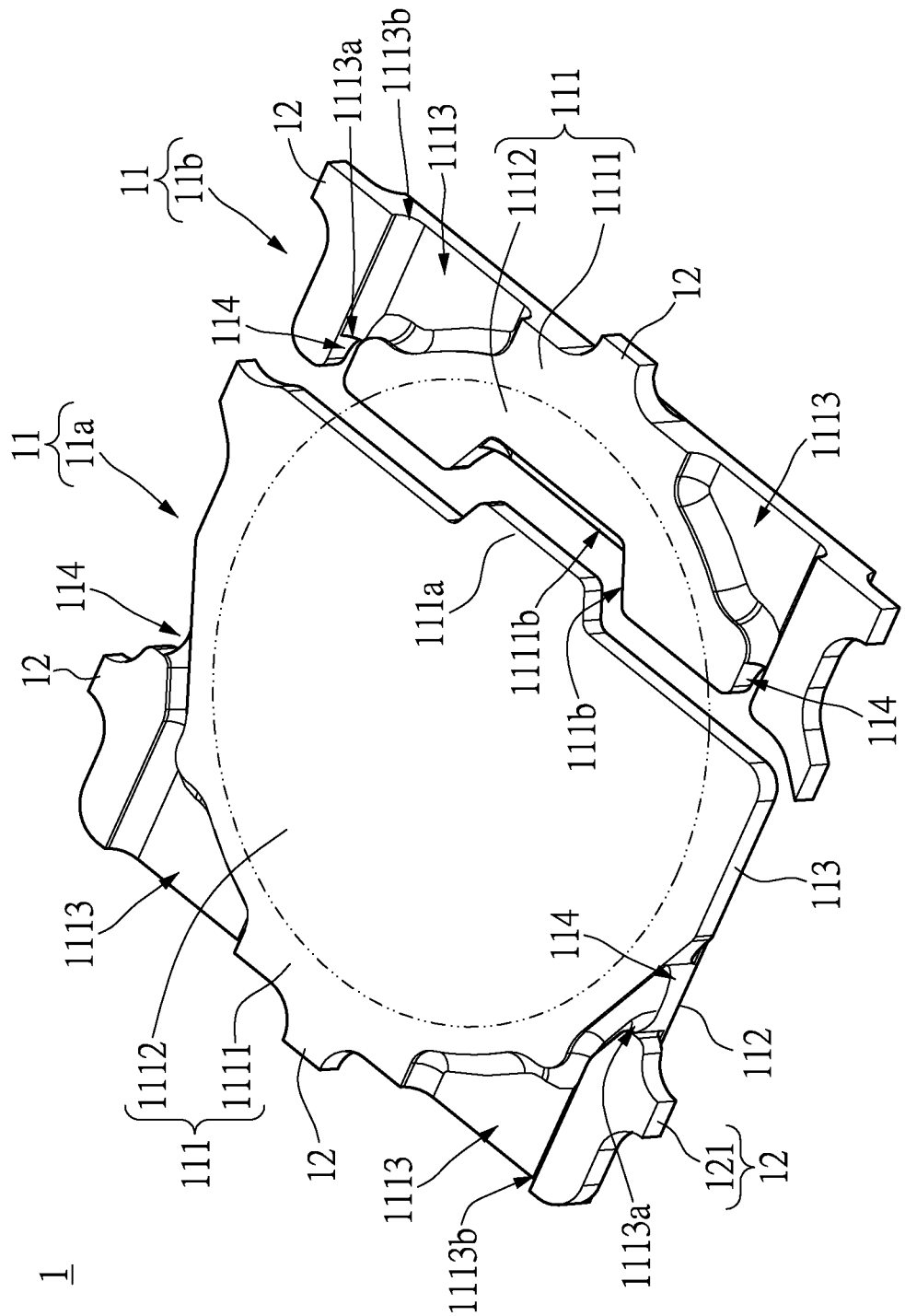
FIG. 3 is a perspective view of a metallic frame of FIG. 1.

Please refer to FIGS. 1 through 3, which show a carrier 100 of an LED structure prepared by the quad flat no-lead (QFN) process. The carrier 100 includes a metallic frame 1 and an insulating housing 2. The metallic frame 1 has two conductive frames 11 spaced apart from each other with a gap and a plurality of extending arms 12 respectively and integrally extended from the conductive frames 11.

The insulating housing 2 is made of the thermosetting material, such as epoxy resin or silicone resin. The insulating housing 2 made of a light-reflection material covers the conductive frames 11 and the extending arms 12, and the conductive frames 11 are separated from each other with the gap by the insulating housing 2. Part surfaces of the conductive frames 11 (i.e., a mounting region 1112 and a welding region 1122 disclosed in the following description) and the end surfaces 121 of the extending arms 12 extending from the conductive frames 11 are exposed from the insulating housing 2, and the surface of the welding region 1122 and the end surfaces 121 of the extending arms 12 are coplanar with the insulating housing 2. The gap between the conductive frames 11 is filled with the insulating housing 2, and the insulating housing 2 filled between the conductive frames 11 is defined as an insulating partition 21. It worth noting that the material of the insulating housing 2 is not limited to the thermosetting material. For example, the insulating housing 2 can be formed of the thermoplastic material, such as Poly1, 4-cyclohexylene dimethylene terephthalate (PCT).

Please refer to FIG. 3 and with reference occasionally made to FIG. 1, the conductive frames 11 have different constructions and are respectively defined as a first conductive frame 11a having a protruding portion and a second conductive frame 11b having a notch portion in position corresponding to the protruding portion. The conductive frames 11 have the same predetermined thickness (T). Each conductive frame 11 has a top surface 111, a bottom surface 112, and a lateral surface 113 connecting the edges of the top and bottom surfaces 111, 112. The predetermined thickness (T) is the maximum distance that is defined by a distance between the top and bottom surfaces 111, 112 of the conductive frames 11. The top surface 111 of each of the conductive frames 11 has a sealed region 1111 and a mounting region 1112 substantially surrounded by the sealed region 1111. The mounting region 1112 is provided for mounting (or fixing) at least one LED die or provided for bonding wire.

The sealed regions 1111 of the metallic frame are covered by the insulating housing 2, and the mounting regions 1112 are exposed from the insulating housing 2. The mounting regions 1112 are substantially surrounded by the sealed regions 1111. The top surfaces 111 of the conductive frames 11 and the top surface of the insulating partition 21 are substantially coplanar with each other.

The insulating housing 2 has an accommodating hole 22 substantially and concavely formed on a center portion of the top surface thereof. The mounting regions 1112 of the conductive frames 11 are exposed from the insulating housing 2 via the accommodating hole 22. The accommodating hole 22 of the insulating housing 2, as shown in FIG. 1, can be formed with a cylinder trough, but it is not limited thereto. For example, the accommodating hole 22 can be formed in square trough.

Each of the conductive frames 11 has two slots 1113 concavely formed (for example, formed by etching) on the sealed region 1111 of the top surface 111 thereof. Each of the two slots 1113 is substantially formed with a triangle construction, and is communicated with the adjacent lateral surfaces 113 to form with two openings 1113a, 1113b having different sizes on the lateral surfaces 113. Due to the two openings 1113a, 1113b have different sizes, the two openings 1113a, 1113b can be respectively defined as a smaller opening 1113a and a bigger opening 1113b. Each of the two slots 1113 is configured to separate the top surface of at least one of the extending arms 12 from the mounting region 1112. More specifically, the smaller opening 1113a faces inward the conductive frame 11 and is formed on one angle of the triangle construction, and the bigger opening 1113b faces outward the conductive frame 11 and is formed on an opposite side of the angle of the triangle construction. A hypotenuse side of the triangle construction formed with a curved edge is substantially arranged along the periphery of the accommodating hole 22. Moreover, the depth of each of the slots 1113 is preferable half of the predetermined thickness (T/2), but it is not limited thereto. The depth of each of slots 1113 can be approximately quarter of the predetermined thickness (T/4) to three-quarters of the predetermined thickness (3T/4). It's worth noting that, the distance between the slots 1113 and the accommodating hole 22 is at least 100 mm such that the insulating housing 2 can seal the conductive frames 11 and the extending arms 12 firmly.

Specifically, in FIG. 3, each of the slots 1113 is formed with a non-enclosed and half-etched triangle construction. The four slots 1113 of the metallic frame 1 are arranged around the accommodating hole 22 of the insulating housing 2 and respectively formed on four corners of the metallic frame 1. Thus, the top surface 111 of each conductive frame 11 shows step structures by forming the slots 1113, thereby effectively improving the combination strength between the insulating housing 2 and the top surface 111 of the conductive frames 11. Moreover, the joint portion between the insulating housing 2 and the top surface 111 of the conductive frames 11 with the slots 1113 have higher combination ability than that of the periphery region, thereby the mist can be prevented from permeating through the mounting region 1112 via the extending arms 12.

A notch 114 penetrating from the top surface 111 to the bottom surface 112 of the conductive frames 11 is concavely formed on a portion of the lateral surface 113. More specifically, the notch 114 is formed on each of smaller openings 1113a so as to cause the insulating housing 2 filled in the notch 114 to construct a pillar construction. When the carrier 100 is designed to have the maximum area for the mounting region 1112 for mounting die and dissipating heat, the combination area between the insulating housing 2 and the conductive frames 11 is reduced accordingly. Therefore, a plurality of pillar constructions are respectively provided in the notch 114 of the metallic frame 1 for increasing the combination force between the insulating housing 2 and the conductive frames 11.

Figure 4:
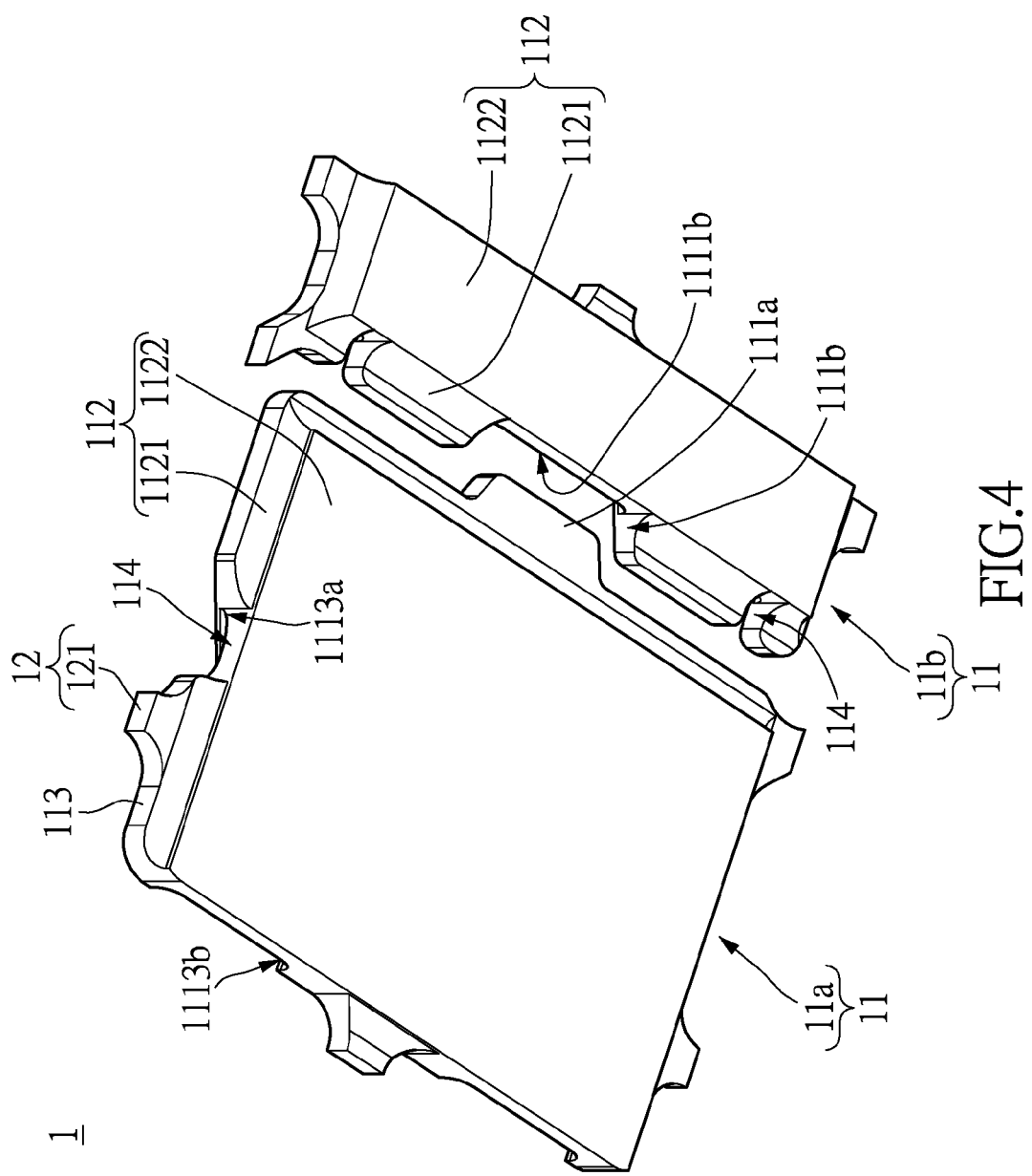
FIG. 4 is a perspective view of the metallic frame in another viewing angle with respective to FIG. 3.

Please refer to FIG. 4 and with reference occasionally made to FIG. 2, the bottom surface 112 for each of the conductive frames 11 has a wrapped region 1121 and a welding region 1122. The wrapped region 1121 is concavely formed (For example, formed by etching) from the edge of the bottom surface 112 (i.e., a portion of the bottom surface 112 connected to the lateral surface 113) to have a trough-like construction. The wrapped region 1121 is covered by the insulating housing 2, and the welding region 1122 is exposed from the insulating housing 2. The welding region 1122 of each of the conductive frames 11 is approximately arranged inside the wrapped region 1121. The welding regions 1122 of the conductive frames 11 and the bottom surface of the insulating housing 2 are substantially coplanar with each other.

The thickness for the lateral surface 113 is substantially half of the predetermined thickness (T/2), but it is not limited thereto. The thickness for the lateral surface 113 can be approximately quarter of the predetermined thickness (T/4) to three-quarters of the predetermined thickness (3T/4).

Each of the extending arms 12 is integrally extended from the lateral surface 113 of the corresponding conductive frame 11, and the thickness for each of the extending arms 12 is substantially identical to that of the corresponding lateral surface 113. That is to say, the thickness for each of the extending arms 12 can be approximately quarter of the predetermined thickness (T/4) to three-quarters of the predetermined thickness (3T/4). The thickness for each of the extending arms 12 in the instant embodiment is substantially half of the predetermined thickness (T/2). In other words, each extending arm 12 approximately has the same thickness with that of a portion of conductive frame 11 formed with the slot 1113.

Figure 5:
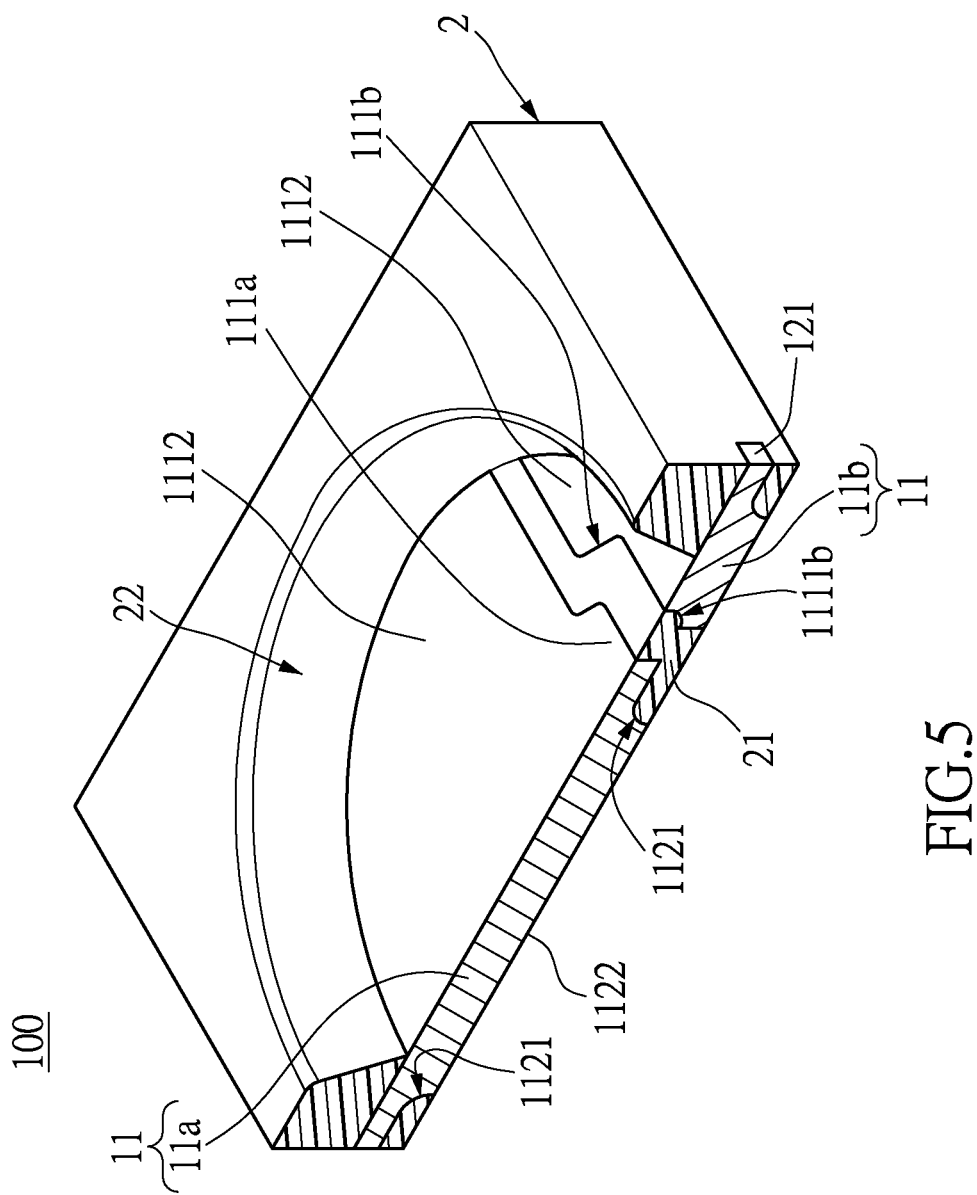
FIG. 5 is a cross-sectional view of FIG. 1 along the line A-A.

Please refer to FIG. 5 and with reference occasionally made to FIGS. 3 and 4, the first conductive frame 11a includes a protruding portion 111a, and a second conductive frame 11b has a notch portion 111b. The notch portion 111b is in position corresponding to the protruding portion 111a. A bottom surface of the protruding portion 111a is formed with the trough-like wrapped region 1121, and a top surface of the notch portion 111b is formed with a trough 1111b, so that the insulating housing 2 made of thermoplastic or thermosetting material filled between the conductive frames 11 is formed with an upper-and-lower malposition construction (As shown in FIGS. 6B and 6C) to enhance the insulating partition 21 and to improve the combination strength between the insulating housing 2 and the conductive frames 11.

The metallic frame 1 of the instant disclosure adapts the first conductive frame 11a having the protruding portion 111a and the second conductive frame 11b having the notch portion 111b, such that the cooperation of the protruding portion 111a and the notch portion 111b for the conductive frames 11 is configured to overcome the shearing force, thereby effectively avoiding the insulating partition 21 to peel off from the conductive frames 11.

Figure 6A:
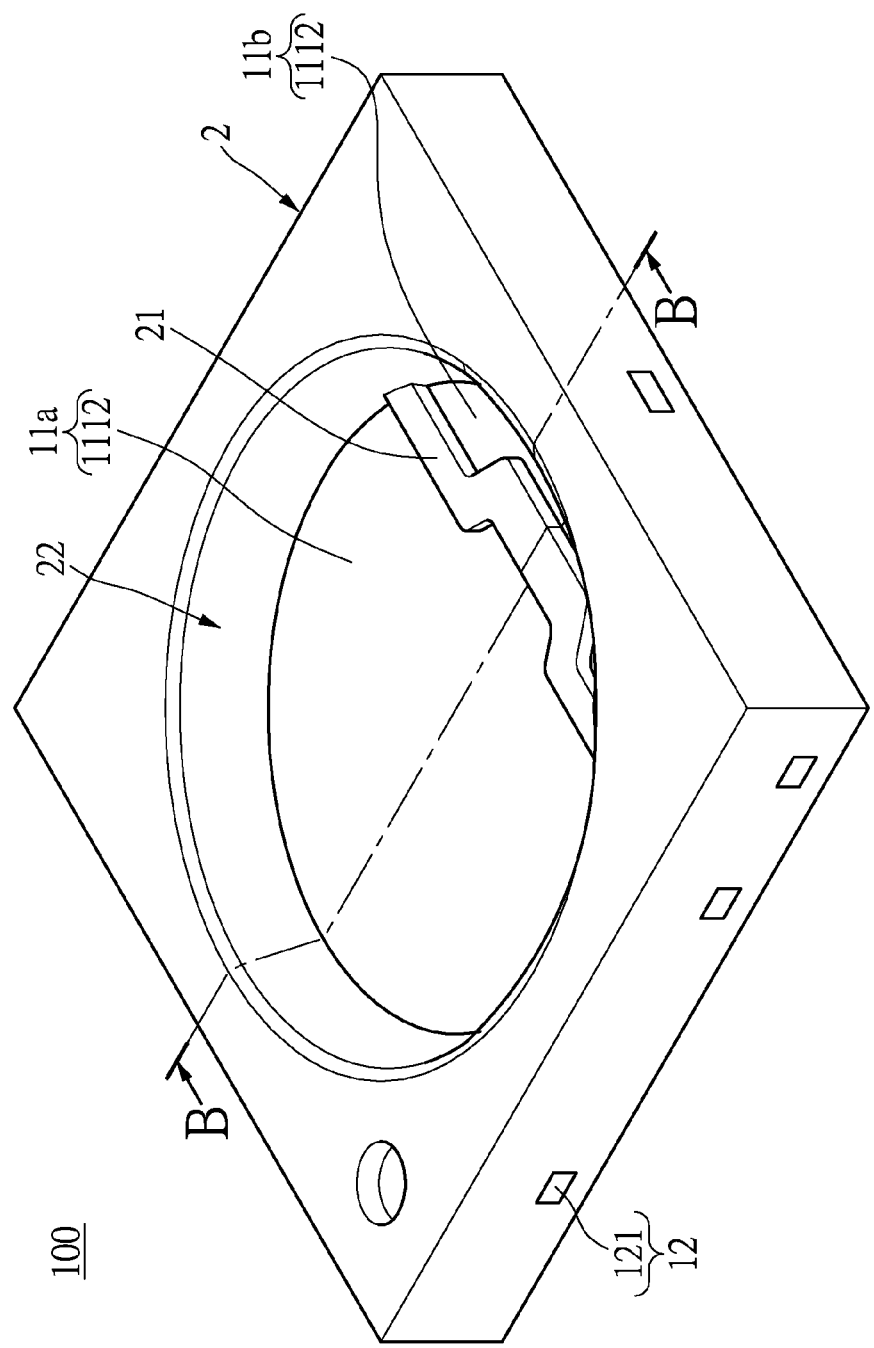
FIG. 6A is a perspective view of the carrier in another type according to the first embodiment of the instant disclosure.
Figure 6B:
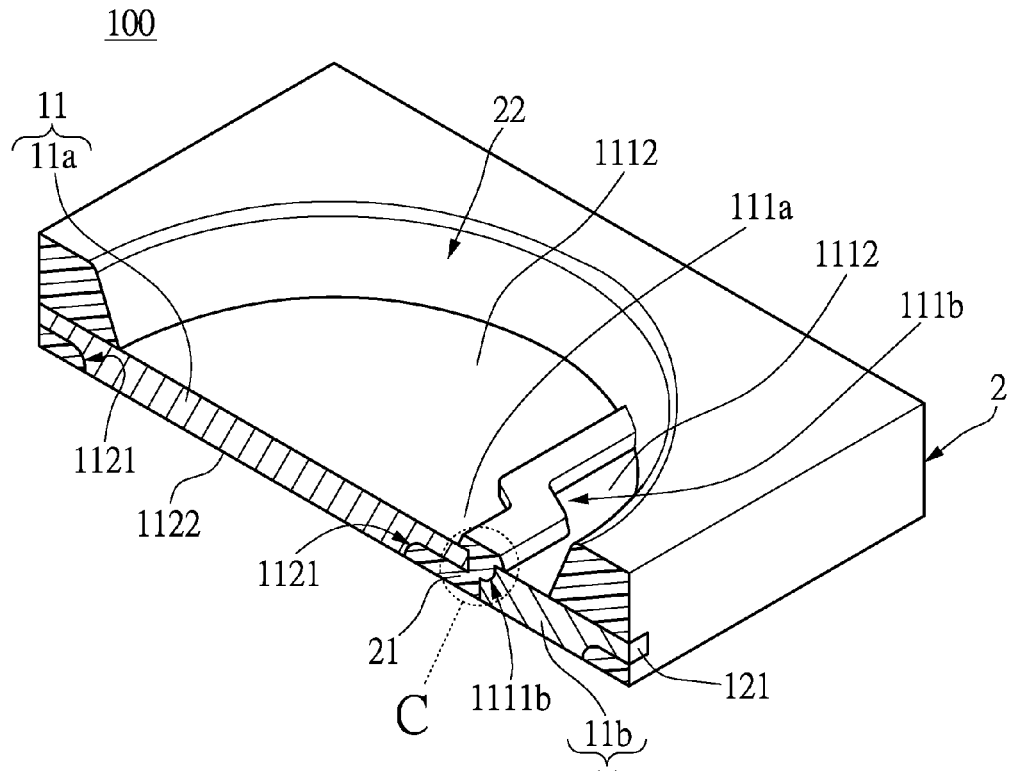
FIG. 6B is a cross-sectional view of FIG. 6A along the line B-B.
Figure 6C:
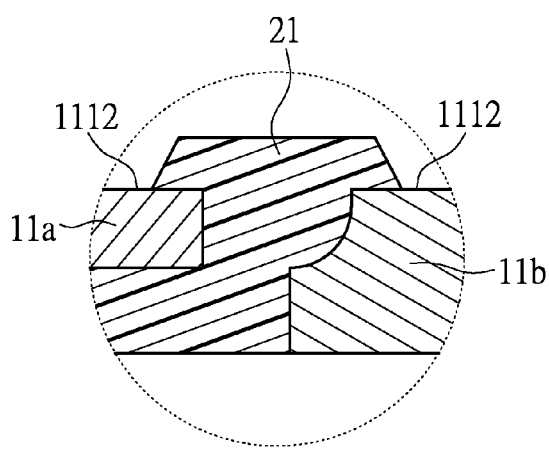
FIG. 6C is a partially enlarge view of the region C of FIG. 6B.

Please refer to FIG. 6A, the insulating partition 21, which is arranged in the accommodating hole 22, is protrudingly higher than the mounting regions 1112 of the first and second conductive frames 11a, 11b, thereby reducing permeation of the mist and avoiding light generated from the LED die to leak from the bottom of the carrier 100. Specifically, as shown in FIGS. 6B and 6C, the insulating partition 21, which is arranged in the accommodating hole 22, is preferable higher than the mounting regions 1112 of the first and second conductive frames 11a, 11b with a height of 300-500 mm, and the insulating partition 21, which is covering on the mounting regions 1112, preferably has a covering width of 300-500 mm, so that the permeation of mist via the bottom of the carrier 100 can be effectively blocked, and the insulating partition 21 does not shield the light generated from the LED die, thereby the brightness of the LED package structure is not affected.

Moreover, other components can be cooperated with the carrier 100 to form an LED structure. Please refer to FIG. 7, which shows an LED structure including the carrier 100, two LED dies 200 mounted on the carrier 100, a light-transmitting element 300 (e.g., lens) disposed on the carrier 100 and encapsulating the two LED dies 200. However, it's not limited to two LED dies 200, the carrier also can be mounted one LED die thereon, such as high-voltage chip with 5-7 driving voltages, so as to formed an LED structure with high light efficiency.

Figure 8:
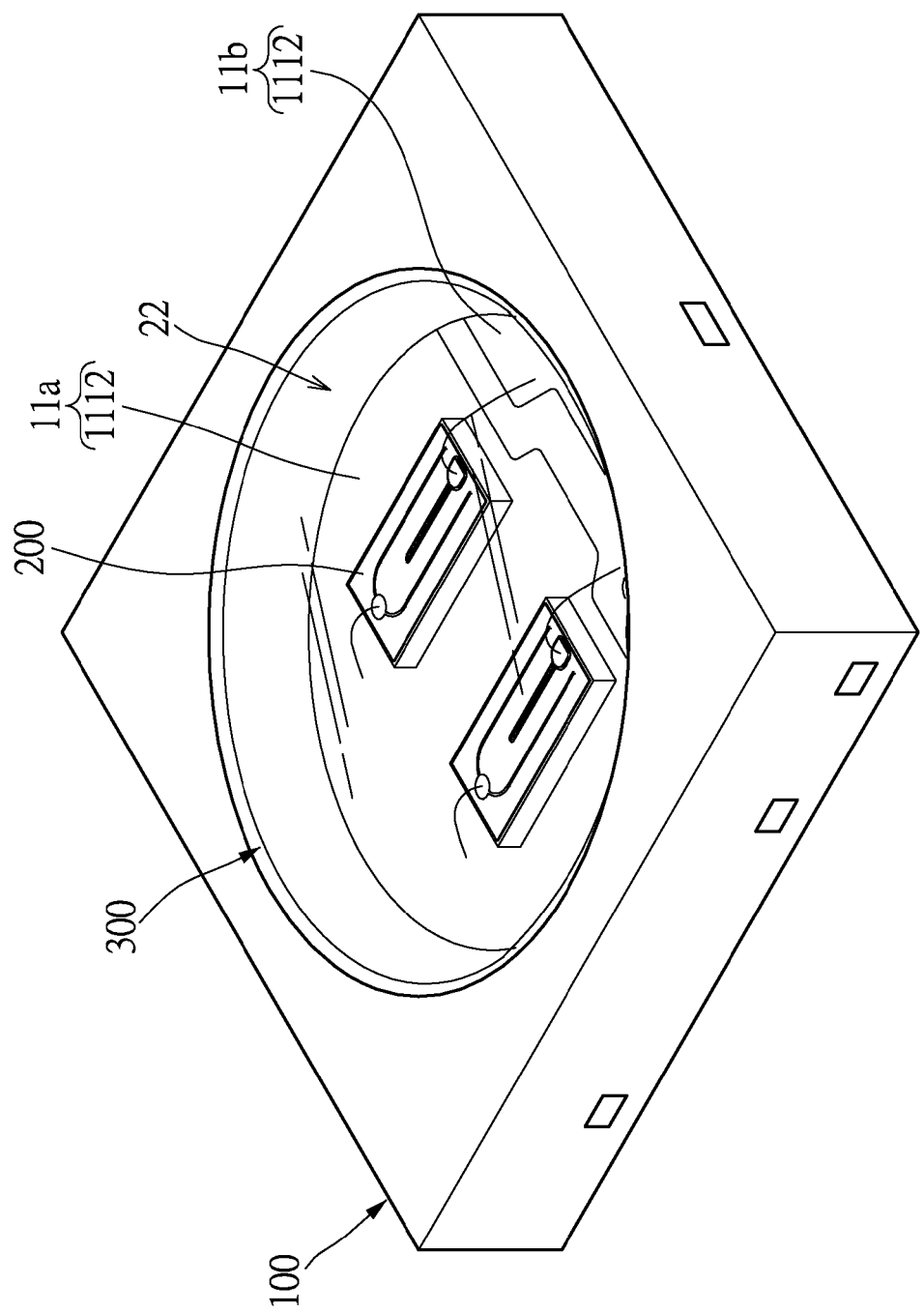
FIG. 8 is a perspective view of the LED structure in another type according to the first embodiment of the instant disclosure.

The type of the LED dies 200 can be wire-bonding type or flip chip type. The LED dies 200 are arranged in the accommodating hole 22 of the insulating housing 2 and are mounted on the mounting region 1112 of the first conductive frame 11a. Each of the LED dies 200 of the instant embodiment is electrically connected to the first and second conductive frames 11a, 11b by bonding wires. Part of the light-transmitting element 300 is filled in the accommodating hole 22 of the insulating housing 2 to seal the LED dies 200, and the other part of the light-transmitting element 300 is a hemispherical construction arranged above the top surface of the insulating housing 2. Additionally, the light-transmitting element 300 can be formed as shown in FIG. 8, that is to say, the light-transmitting element 300 is just filled in the accommodating hole 22, and the top surface of the light-transmitting element 300 and the top surface of the insulating housing 2 are in coplanar arrangement. However, it's not limited to two LED dies 200 in this embodiment, the carrier also can be mounted one LED die thereon, such as high-voltage chip with 5-7 driving voltages, so as to formed an LED structure with high light efficiency.

Figure 9:
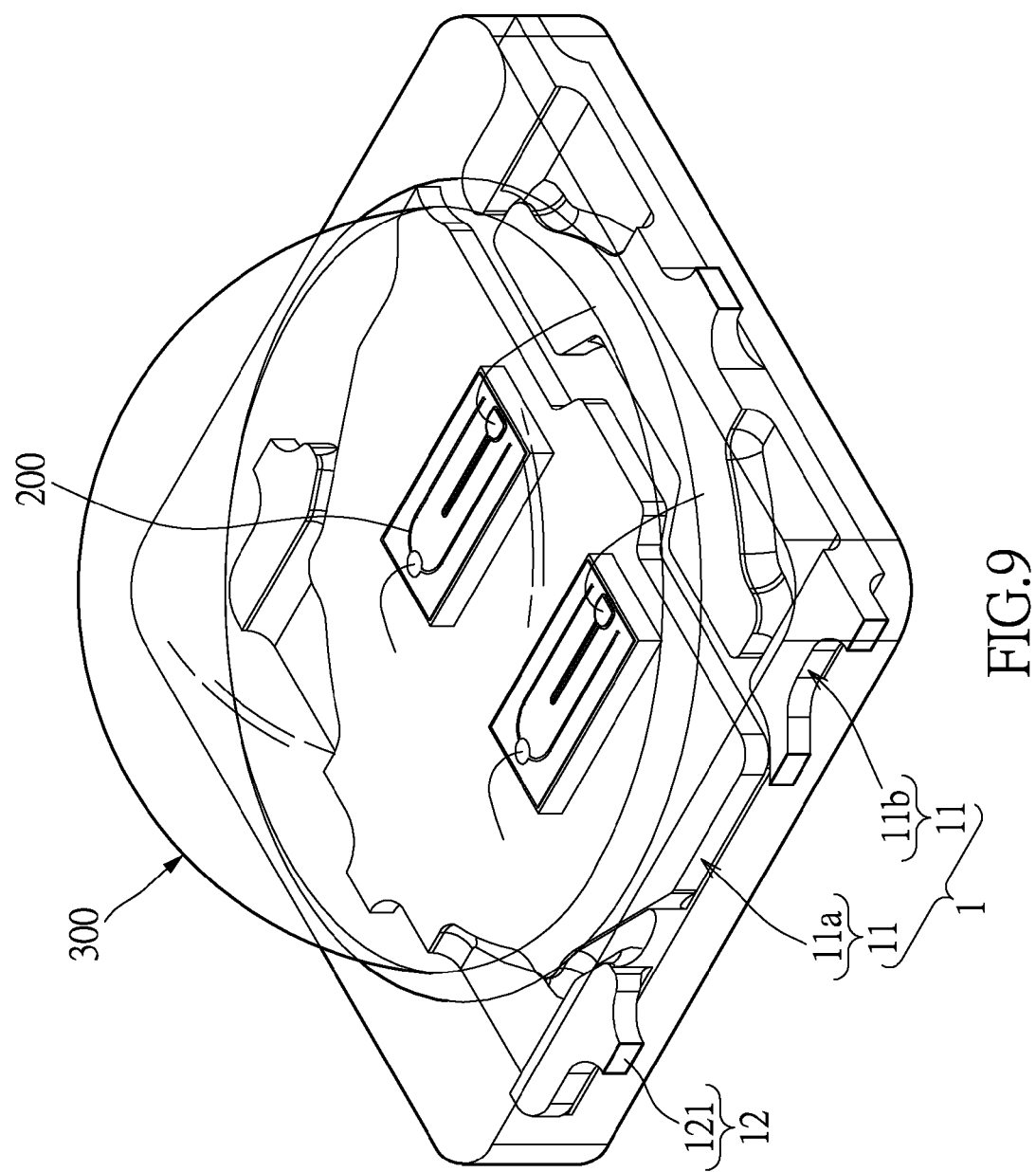
FIG. 9 is a perspective view of the LED structure in still another type according to the first embodiment of the instant disclosure.

The LED structure formed just by the metallic frame 1, the LED dies 200, and the light-transmitting element 300 is provided in this embodiment. As shown in FIG. 9, the conductive frames 11 and the LED dies 200 are integrally encapsulated by the light-transmitting element 300 to form an LED structure. In other words, the insulating housing 2 can be replaced by the light-transmitting element 300, and the welding regions 1122 located on the bottom surface 112 of the conductive frames 11 and the end surfaces 121 of the extending arms 12 are exposed from the light-transmitting element 300. However, it's not limited to two LED dies 200 in this embodiment, the carrier also can be mounted one LED die thereon, such as high-voltage chip with 5-7 driving voltages, so as to formed an LED structure with high light efficiency.

In summary, the LED structure formed by the metallic frame 1, at least one LED die 200 disposed on the metallic frame 1, and an insulating body covering the metallic frame 1 and the LED die 200 is provided in the instant embodiment.

Figure 7:
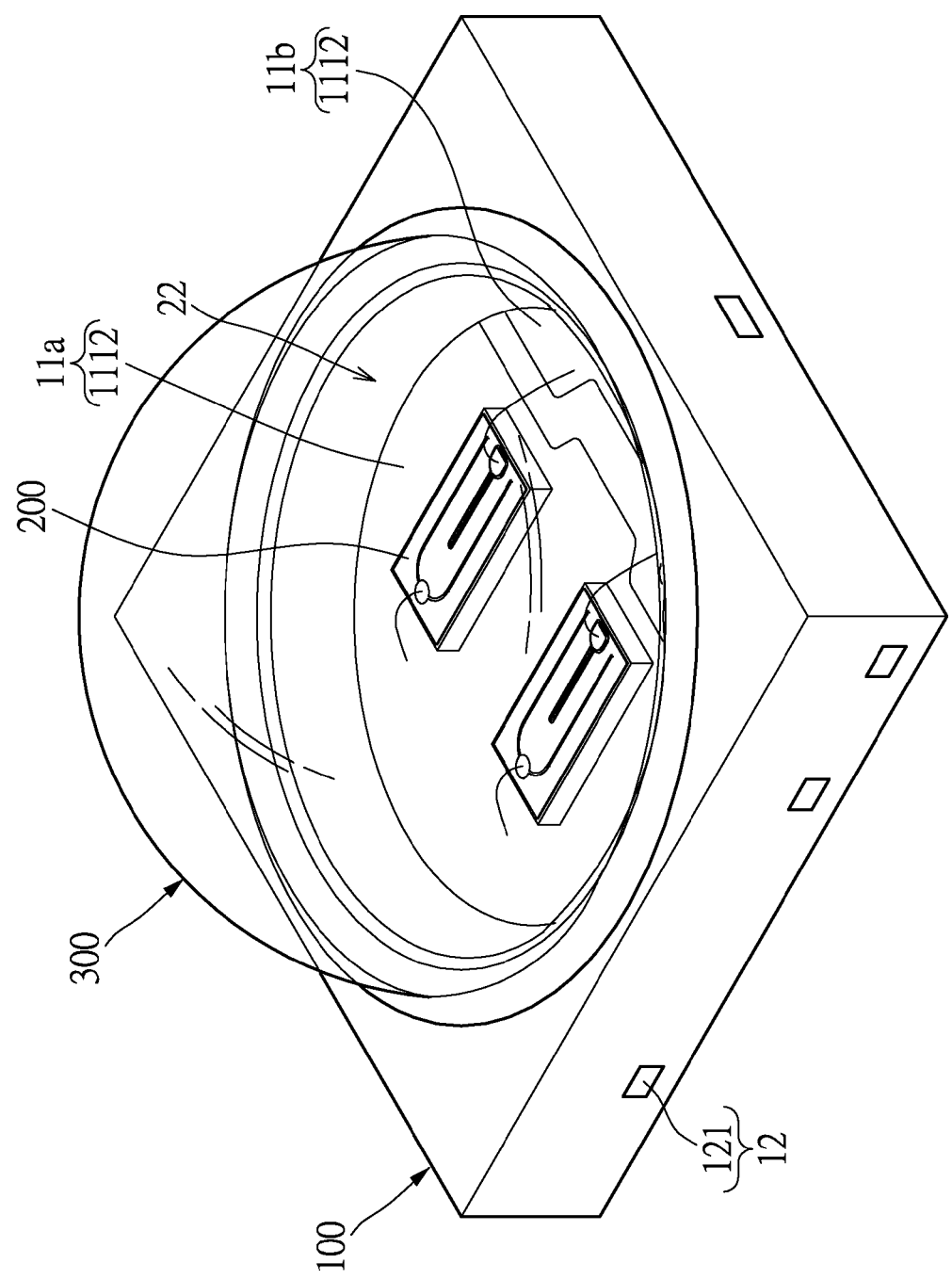
FIG. 7 is a perspective view of an LED structure according to the first embodiment of the instant disclosure.

As shown in FIG. 7 or 8, the insulating body of the LED structure includes the insulating housing 2 and the light-transmitting element 300. As shown in FIG. 9, the insulating body of the LED structure only includes the light-transmitting element 300. No matter what kind of type the LED structure is, the welding regions 1122 located on the bottom surfaces 112 of the conductive frames 11 and the end surfaces 121 of each of the extending arms 12 are exposed from the insulating body.

Figure 10:
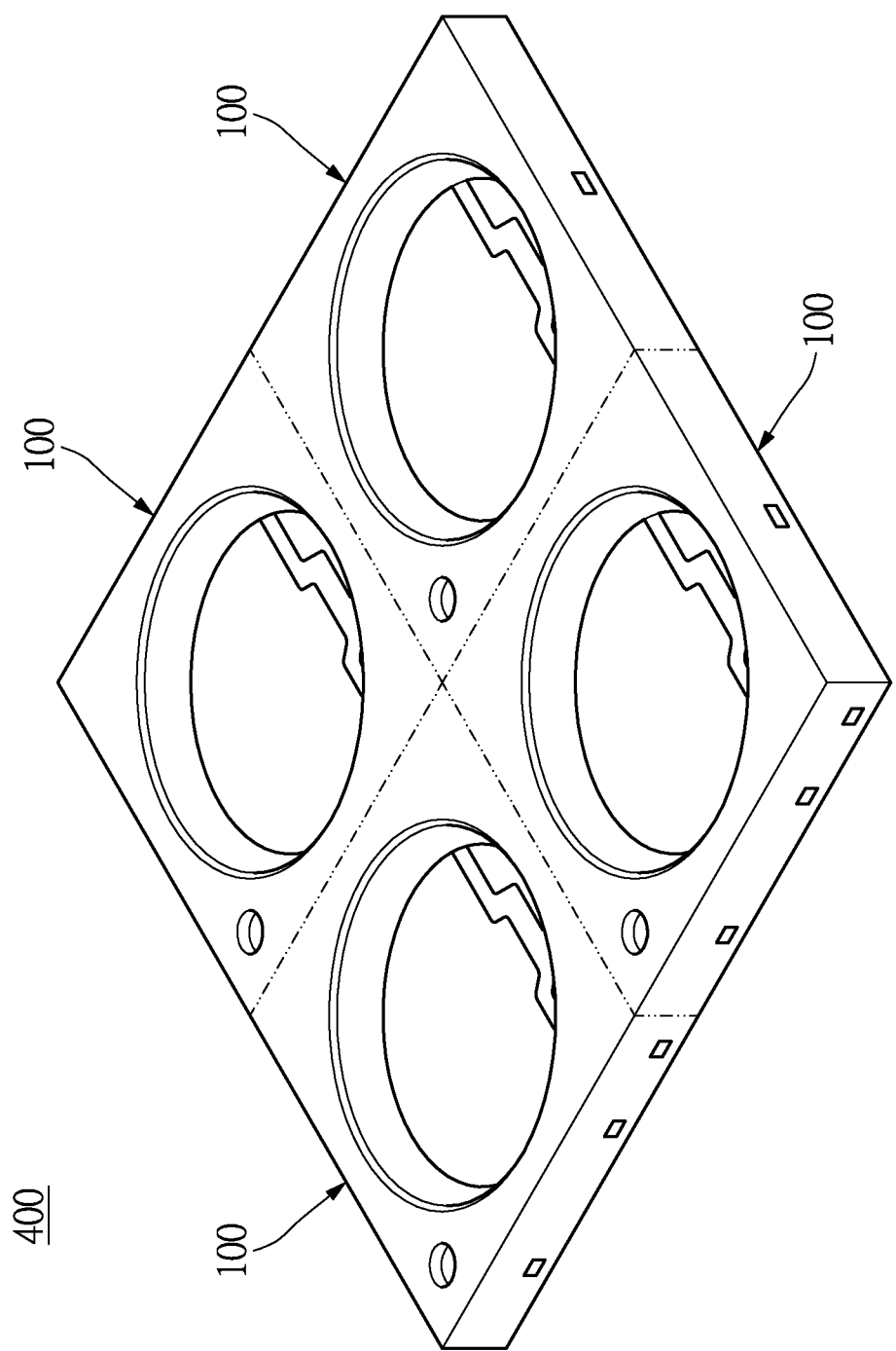
FIG. 10 is a perspective view of a carrier module according to the first embodiment of the instant disclosure.

As shown in FIG. 10, the carrier module 400 has a plurality of carriers 100 integrally connected for providing a plurality of LED dies 200 to be mounted thereon. After singulation process, the plurality of carriers 100 are obtained. In order to explain clearly, the figures of the instant embodiment only disclose the carrier module 400 having part of the carriers 100.

Figure 11:
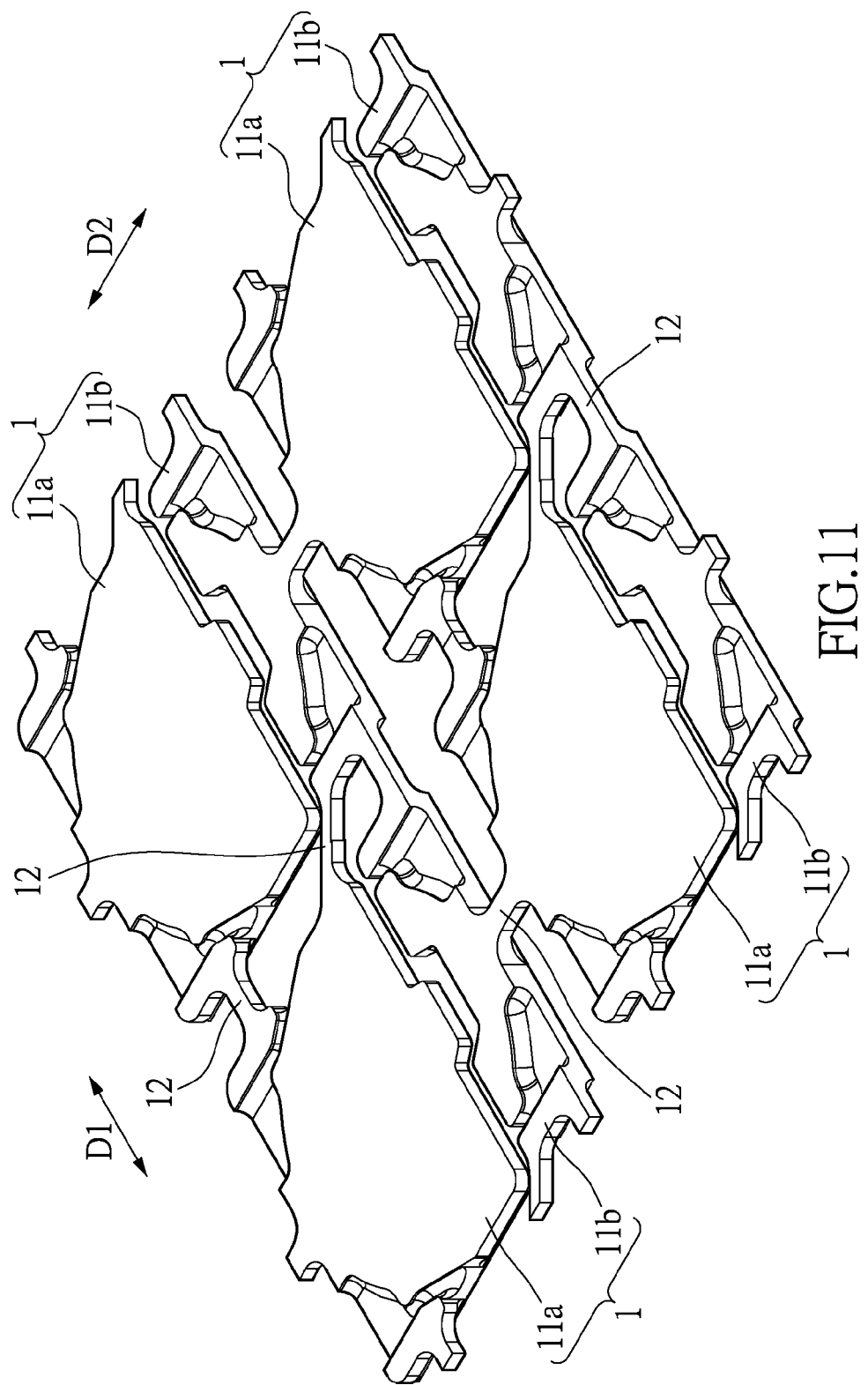
FIG. 11 is a perspective view of the metallic frames of FIG. 10.
Figure 12:
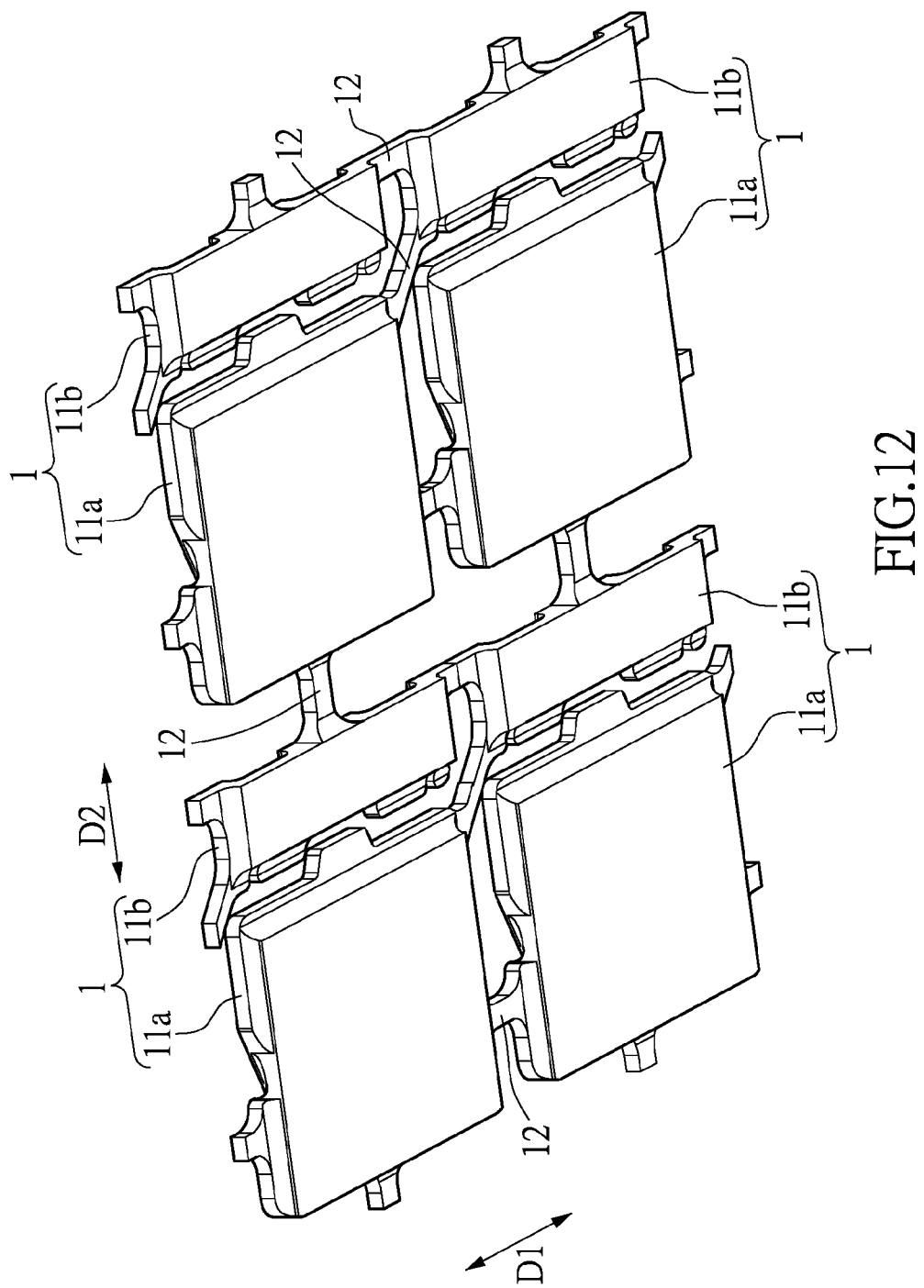
FIG. 12 is a perspective view of the metallic frames in another viewing angle with respective to FIG. 11.

Before forming the insulating housings 2, a plurality of metallic frames 1 are integrally formed with a panel-like construction (as shown in FIGS. 11 and 12). In a first direction D1, the two adjacent first conductive frames 11a are integrally connected by the respective extending arms 12 thereof, the two adjacent second conductive frames 11b are integrally connected by the respective extending arms 12 thereof, and the extending arms 12 as mentioned above are substantially parallel to the first direction D 1. In a second direction D2 which is perpendicular to the first direction D1, the extending arms 12 extended from the first conductive frames 11a 1 are integrally connected to the extending arms 12 extended from the second conductive frames 11b, and the extending arms 12 as mentioned above are substantially parallel to the second direction D2.

Expect for the extending arms 12 parallel to the first and second directions D1, D2, the extending arm 12 extended from the first conductive frame 11a is slantingly and integrally connected to the extending arm 12 extended from the second conductive frame 11b of another metallic frame 1, and the extending arms 12 as mentioned above are intersecting to the first direction D1 with an inclined angle so as to construct a slanted structure. Thus, the extending arms 12 slantingly and integrally connected to each other are configured to enhance the stability of two adjacent metallic frames 1, such that the yield for molding the insulating housing 2 by injection can be increased and the burr generated by glue can be improved.

Figure 13:
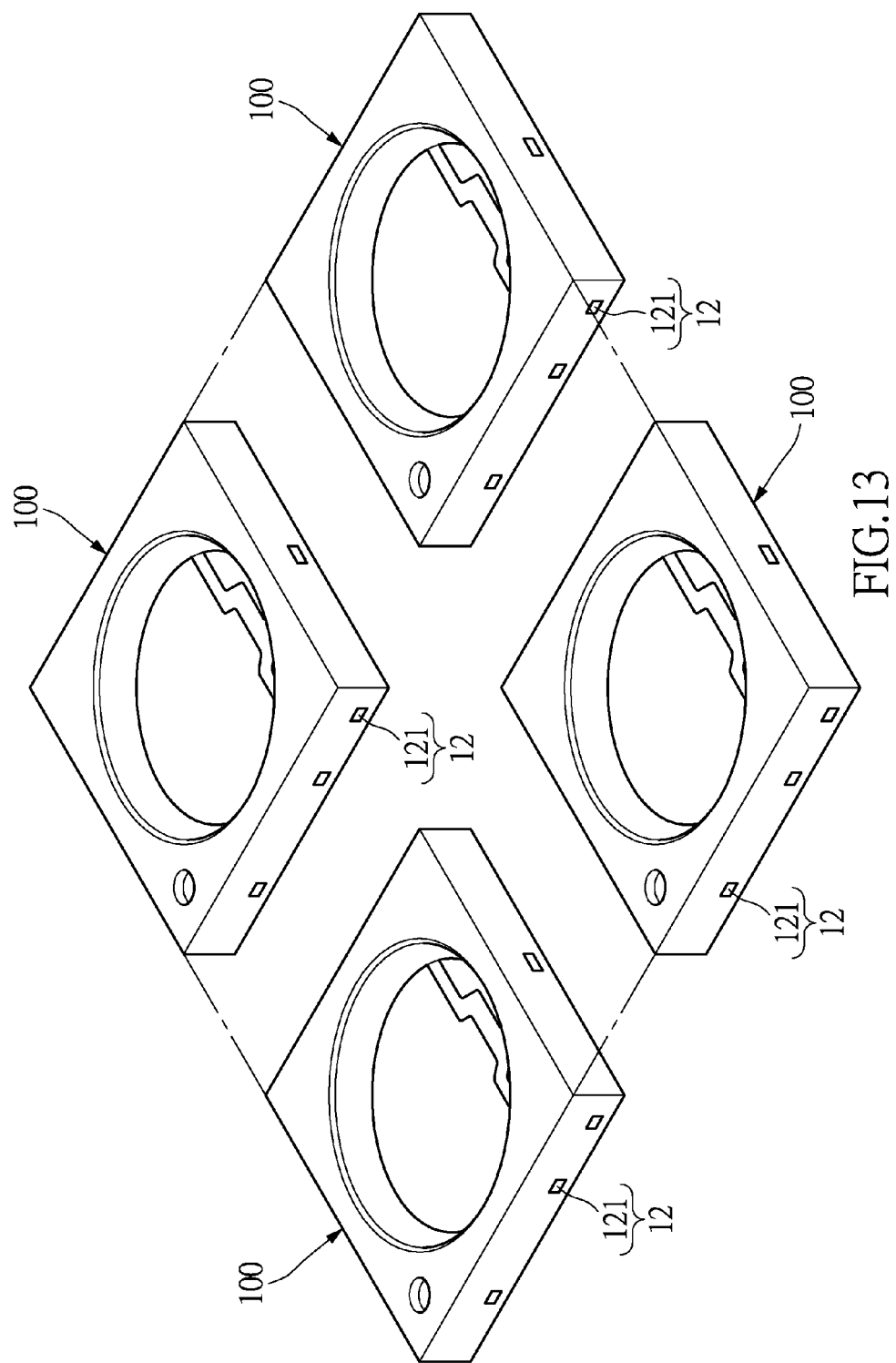
FIG. 13 is a perspective view of the separated carriers after singulating the carrier module of FIG. 10.

After a plurality of insulating housings 2 are respectively formed on the connected metallic frames 1 and integrally formed in one-piece, a singulation process can be implemented on the carrier module 400 to separate the carriers 100 from each other (as shown in FIG. 13).

The thickness of each of the extending arms 12 is smaller than the predetermined thickness (T) of the conductive frame 11, such as the thickness of each of the extending arms 12 can be quarter of the predetermined thickness (T/4) to three-quarters of the predetermined thickness (3T/4). Thus, during the singulation process, the cutting thickness for cutting the extending arm 12 by a cutting tool is decreased such that the consumption of the cutting tool and the probability of the burr can be reduced accordingly. Furthermore, the end surfaces 121 of extending arms 12 (i.e., cutting section) are not easily to separate from the insulating housings 2, the mist permeating into the mounting region 1112 of the carrier 100 along the extending arms 12 can be suspended.

Second Embodiment

Please refer to FIGS. 14 through 18, which show a second embodiment of the instant disclosure. The instant embodiment is similar to the first embodiment, so the identical features do not disclose again. The main difference between the two embodiments is that the distribution of the slots 1113 of the conductive frames 11.

Figure 14:
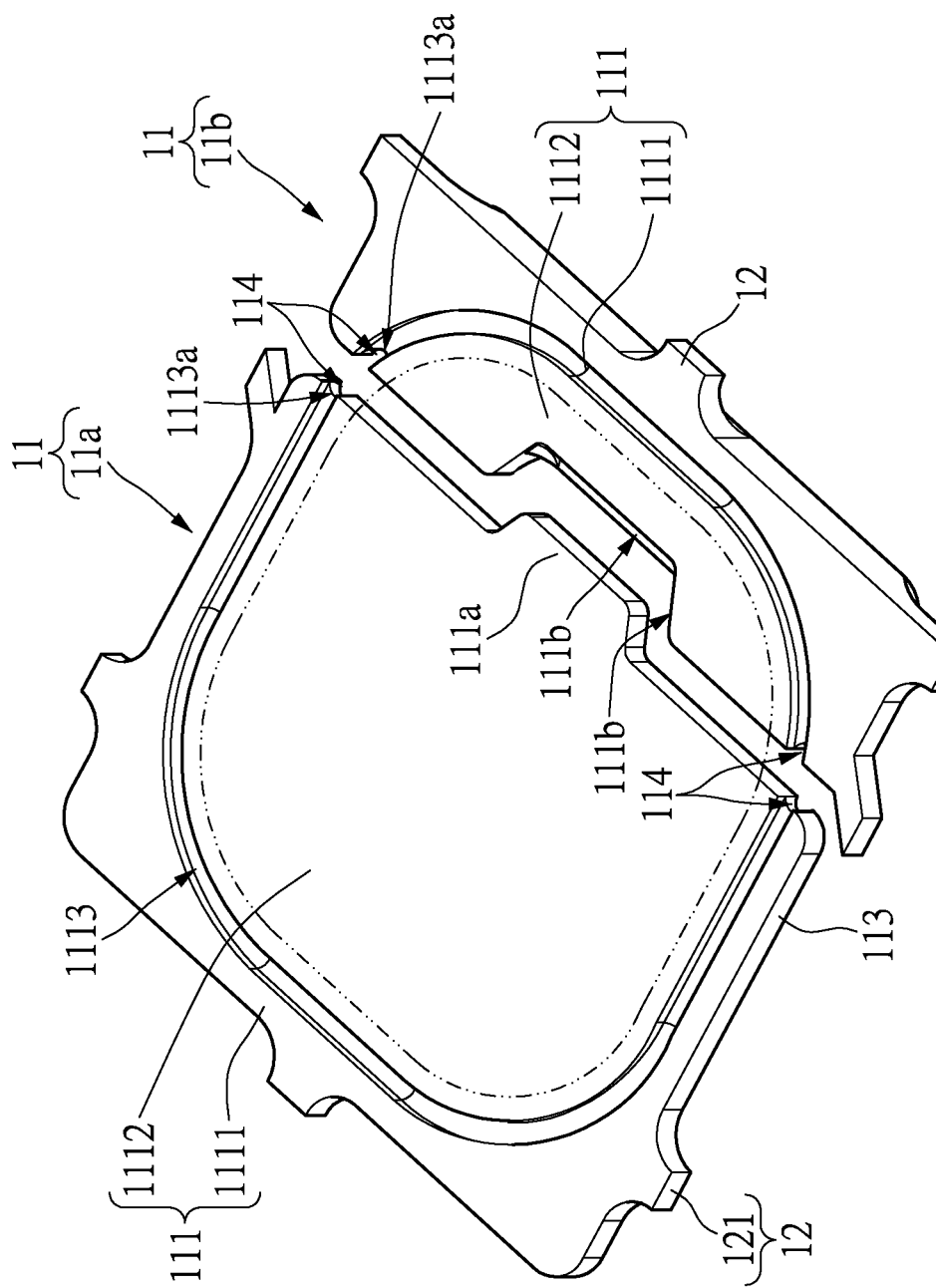
FIG. 14 is a perspective view of the metallic frame according to a second embodiment of the instant disclosure.
Figure 15:
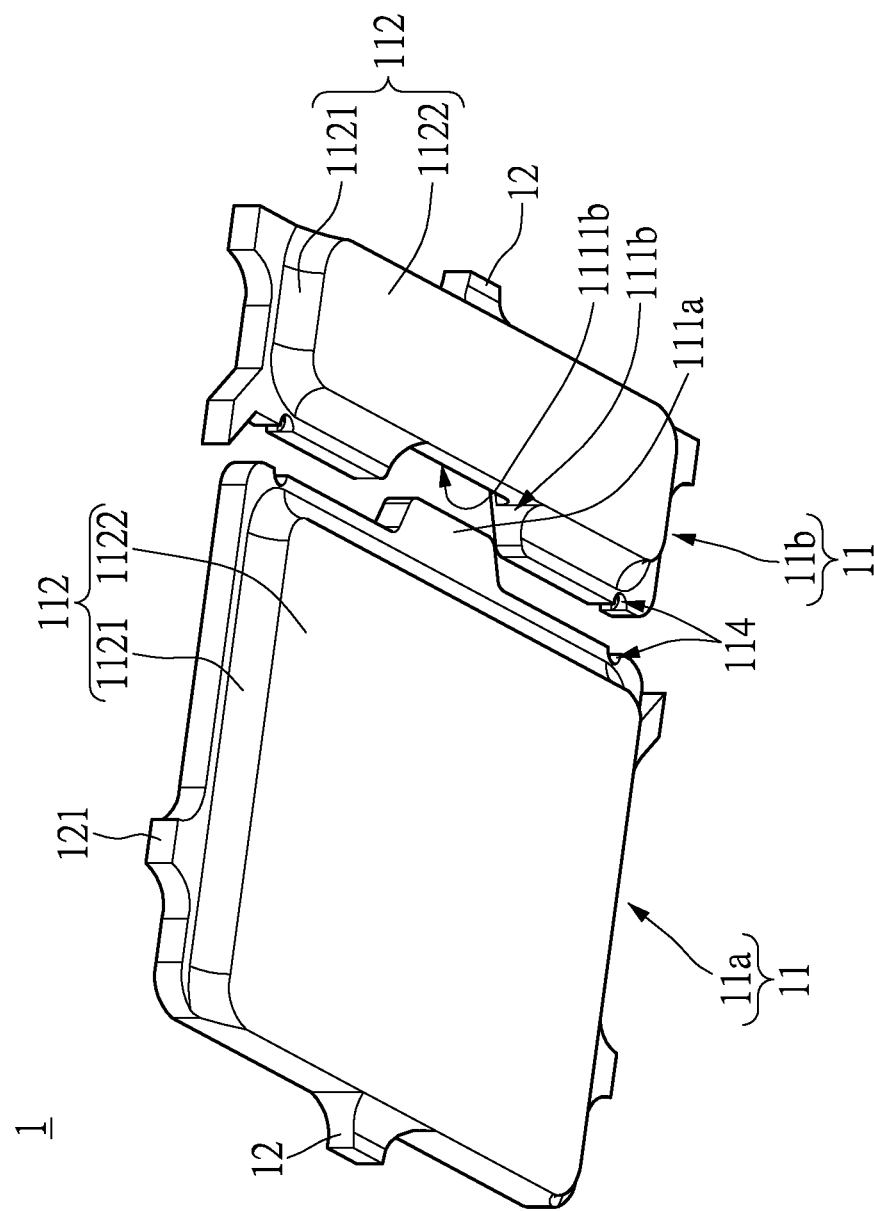
FIG. 15 is a perspective view of the metallic frame in another viewing angle with respective to FIG. 14.

As shown in FIGS. 14 and 15, each of the conductive frames 11 has a slot 1113 concavely formed (i.e., etched) on the sealed region 1111 located on the top surface 111 thereof. Each of the slots 1113 has an U-shaped construction and the width of slot 1113 is identical. The two U-shaped slots 1113 are arranged outside the mounting region 1112 (or outside the accommodating hole 22 of the insulating housing 2) to surround the mounting region 1112. Specifically, the two U-shaped slots 1113 of the metallic frames 1 surround the mounting regions 1112 and are arranged inside the contours of the metallic frame 1. That is to say, the inner edge of the slots 1113 of the metallic frame 1 is substantially larger than or identical to the outer edge of the mounting regions 1112 of the metallic frame 1, and the outer edge of the slots 1113 of the metallic frame 1 is smaller than or identical to the contour of the metallic frame 1.

The slots 1113 of the conductive frames 11 are respectively communicated with the lateral surfaces 113 facing to each other, and each of the slots 1113 has two identical openings 1113a having the same size formed on the lateral surface 113. The slots 1113 are communicated with the two openings 1113a and the two openings 1113a are arranged on ends of the U-shaped construction, so that each of the slots 1113 is configured to separate all of the extending arms 12 from the mounting region 1112.

The depth of each of the slots 1113 is approximately half of the predetermined thickness (T/2). The width of each of the slots 1113 is smaller than or equal to the predetermined thickness (T), but they are not limited thereto. The depth of each of the slots 1113 can be approximately quarter of the predetermined thickness (T/4) to three-quarters of the predetermined thickness (3T/4).

Moreover, a notch 114 penetrating from the top surface 111 to the bottom surface 112 is formed on a portion of the lateral surface 113 corresponding to each of the openings 1113a.

Figure 16:
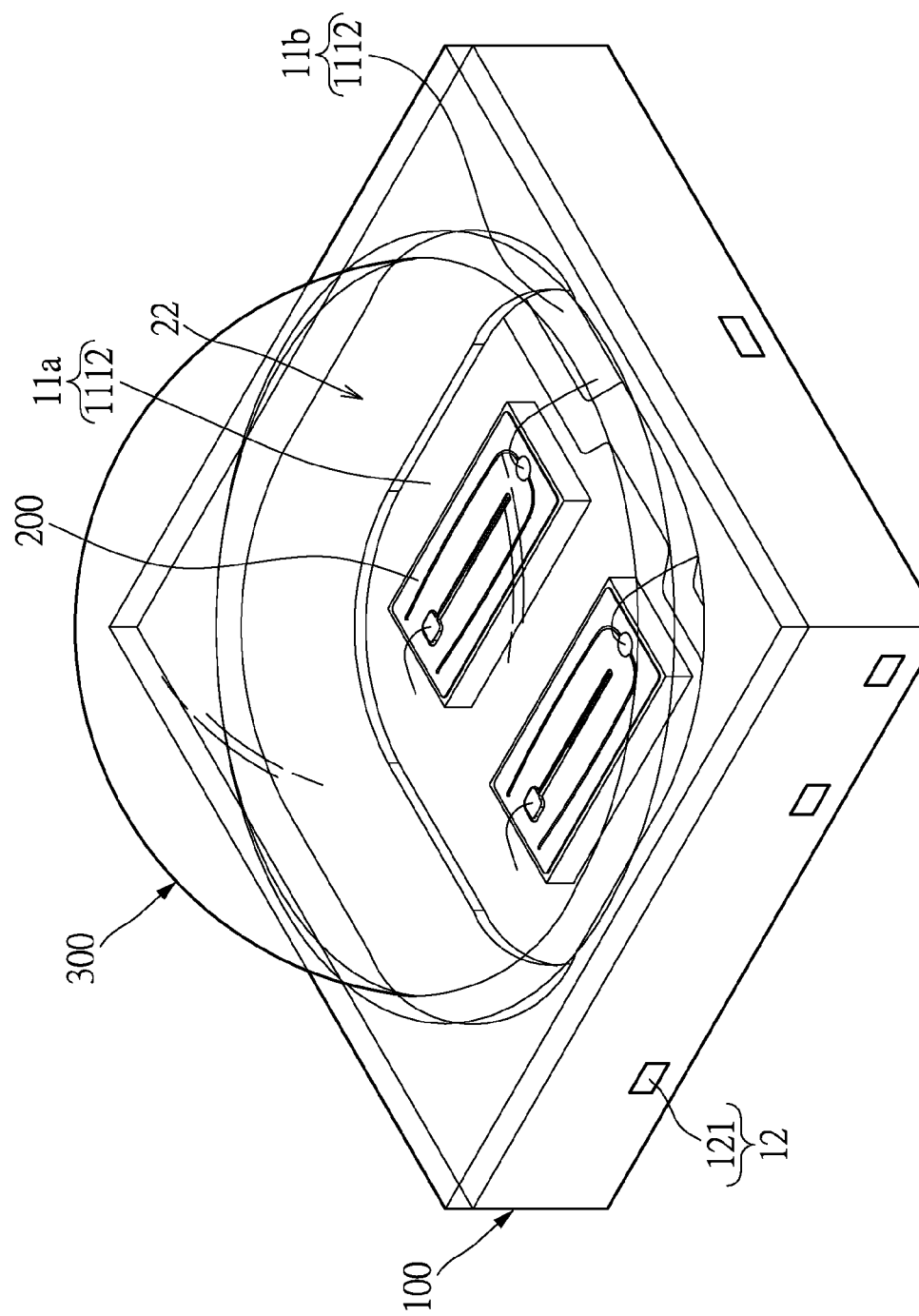
FIG. 16 is a perspective view of the LED structure according to the second embodiment of the instant disclosure.
Figure 17:
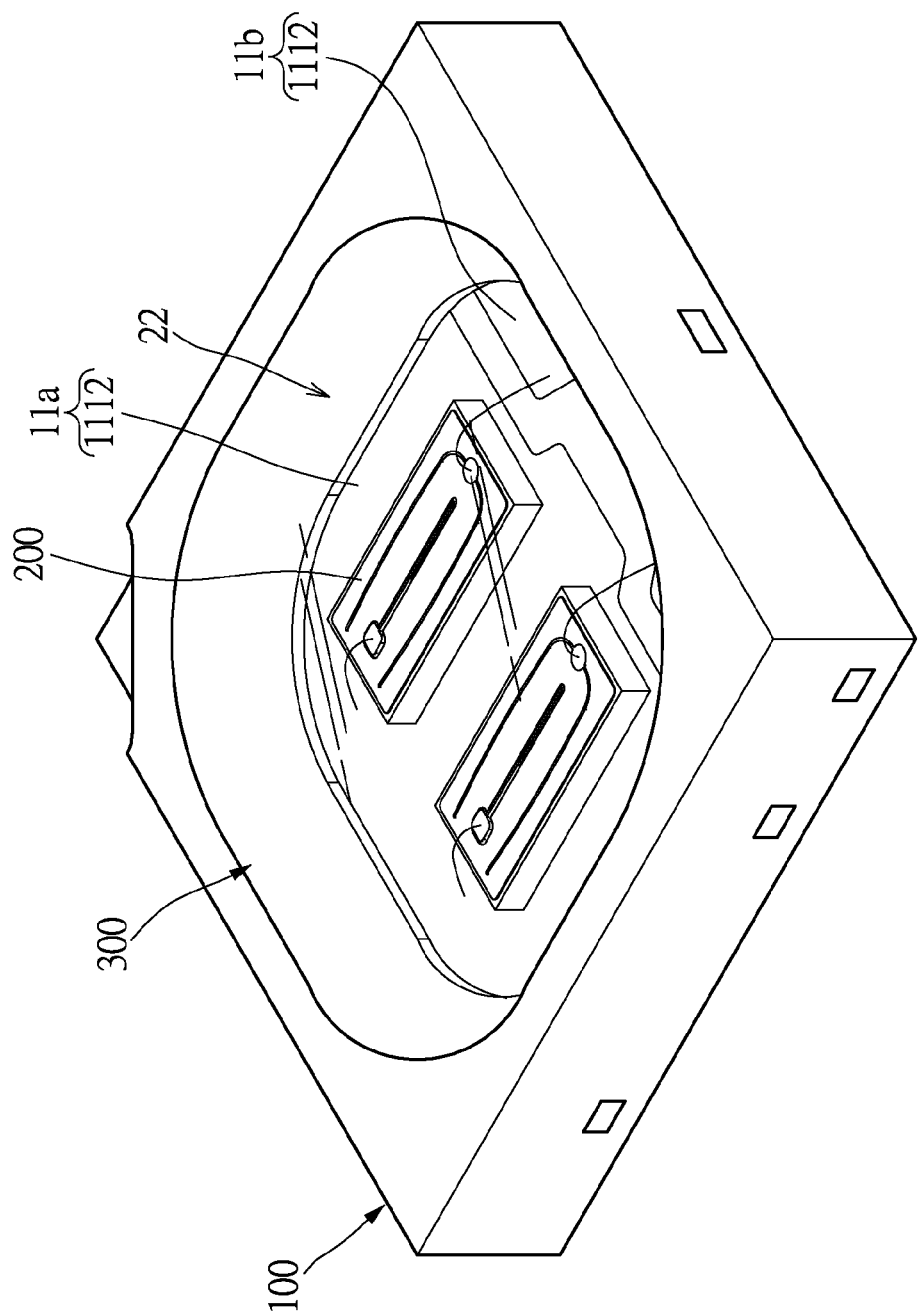
FIG. 17 is a perspective view of the LED structure in another type according to the second embodiment of the instant disclosure.
Figure 18:
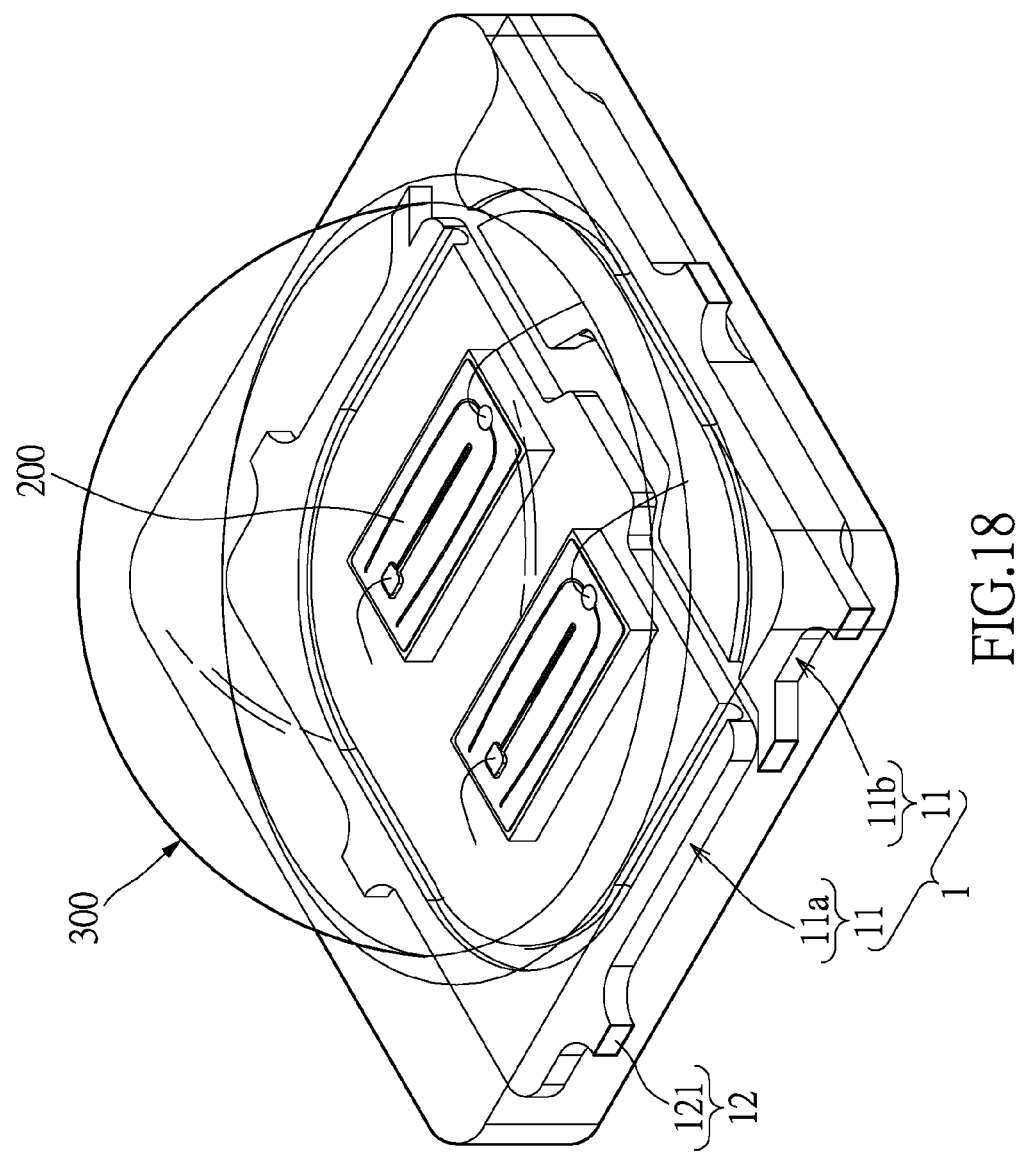
FIG. 18 is a perspective view of the LED structure in still another type according to the second embodiment of the instant disclosure.

Additionally, the LED structure of the instant embodiment can be formed similar to FIGS. 7 through 9. For example, the LED structure as shown in FIG. 16 is corresponding to the LED structure of the first embodiment as shown in FIG. 7; the LED structure as shown in FIG. 17 is corresponding to the LED structure of the first embodiment as shown in FIG. 8; and the LED structure as shown in FIG. 18 is corresponding to the LED structure of the first embodiment as shown in FIG. 9.

[The Possible Effects of the Instant Embodiment]

In summary, the combination strength between the insulating body and the top surface of each conductive frame can be improved by forming the slot in the instant disclosure, such that the mist can be prevent from permeating into the mounting region along the extending arms. Furthermore, the combination strength between the insulating housing and the conductive frame can be increased by forming the pillar constructions on the metallic frame.

Specifically, in the first embodiment, based on the accommodating hole formed in circular trough type and the limited sealed regions, the slots are arranged on four corners of the metallic frame and communicated with the corresponding lateral surface to form the half-etched triangle constructions, thereby increasing the combination strength between the insulating housing and the conductive frames. In the second embodiment, based on the accommodating hole formed in square trough type, the slots are formed in U-shaped construction along the outer edge of the accommodating hole for increasing the combination strength between the insulating housing and each conductive frame.

The metallic frame of the instant disclosure adapts the cooperation of the conductive frames having a protruding portion and a notch portion to overcome the shearing stress, thereby effectively avoiding the insulating housing to peel off from the conductive frames. Moreover, the bottom surface of the protruding portion is formed with the trough-like construction, and the top surface of the concave portion is formed with the trough, so that the insulating housing filled between the conductive frames is the upper-and-lower malposition construction to enhance the mechanical strength of the insulating partition and to improve the combination of the insulating housing and the conductive frames.

The extending arms of the instant disclosure slantingly and integrally connected to each other are configured to enhance the stability of two adjacent metallic frames, such that the yield for molding the insulating housing by injection can be increased and the burr can be improved. Moreover, the thickness of each extending arm is smaller than the predetermined thickness (T) of the conductive frame, so that during the singulation process, cutting the extending arm by the cutting tool is easier for reducing the consumption of the cutting tool and the burr, thereby avoiding mist permeates into the mounting region of the carrier via the extending arms.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. An LED structure, comprising:
   a metallic frame having a first conductive frame, a second conductive frame, a plurality of first extending arms, and a plurality of second extending arms, the first conductive frame and the second conductive frame being spaced apart from each other, the plurality of first extending arms extending from the first conductive frame, the plurality of second extending arms extending from the second conductive frame, each of the first conductive frame and the second conductive frame having a top surface, a bottom surface, and a lateral surface, the lateral surface connecting the top surface and the bottom surface;
   an insulating body partially sealing the top surface of the first conductive frame and the top surface of the second conductive frame and being formed with a sealed region and a mounting region, the insulating body partially sealing the bottom surface of the first conductive frame and the bottom surface of the second conductive frame, the insulating body sealing the plurality of first extending arms of the first conductive frame and the plurality of second extending arms of the second conductive frame and exposing at least one end surface of the plurality of first extending arms of the first conductive frame and at least one end surface of the plurality of second extending arms of the second conductive frame; and at least one LED die mounted on the mounting region and electrically connected to the first conductive frame and the second conductive frame;

two first triangular-shaped slots concavely formed in the sealed region on the top surface of the first conductive frame, each of the two first triangular-shaped slots having a triangular-shaped bottom surface parallel to the top surface of the first conductive frame; and two second triangular-shaped slots concavely formed in the sealed region on the top surface of the second conductive frame, each of the two second triangular-shaped slots having a triangular-shaped bottom surface parallel to the top surface of the second conductive frame; four first openings are formed on the lateral surface of the first conductive frame and four second openings are formed on the lateral surface of the second conductive frame;

wherein the two first triangular-shaped slots are located in a position on the top surface of the first conductive frame and are communicated with the four first openings so as to separate at least one of the plurality of first extending arms from the mounting region and the two second triangular-shaped slots are located in a position on the top surface of the second conductive frame and communicated with the four second openings so as to separate at least one of the plurality of second extending arms from the mounting region.

2. The LED structure according to claim 1, wherein the insulating body further comprises an insulating partition made of a light-reflection material and formed between the first conductive frame and second conductive frame; and a top surface of the insulating partition is coplanar with or protruding from the top surface of each of the first conductive frame and the second conductive frame.

3. The LED structure according to claim 2, wherein the insulating partition is protruding from the top surface of each of the first conductive frame and the second conductive frame and has a height ranging from 300-500 mm, and a covering width ranging from 300-500 mm.

4. The LED structure according to claim 1, wherein the insulating body is made of a light-reflection material and has an accommodating hole concavely formed on the top surface of the first conductive frame and the top surface of the second conductive frame to expose the mounting region, the at least one LED die is mounted in the mounting region via the accommodating hole of the insulating body; and the insulating body further includes an encapsulant made of a light-transmitting material filled in the accommodating hole of the insulating body to encapsulate the at least one LED die.

5. The LED structure according to claim 1, wherein the insulating body made of a light-transmitting material integrally seals the first conductive frame, the second conductive frame, the plurality of extending arms and the LED die; and the welding region of the first conductive frame, the welding region of the second conductive frame, the at least one end surface of the extending arm of the first conductive frame, and the at least one end surface of the extending arm of the second conductive frame are exposed from the insulating body.

6. A carrier module for providing a plurality of LED dies to be mounted thereon, comprising:

a plurality of metallic frames integrally formed with a panel-like construction, each of the metallic frames having a first conductive frame, a second conductive frame, a plurality of first extending arms extending from the first conductive frame, and a plurality of second extending arms extending from the second conductive frame, each of the first conductive frame and the second conductive frame having a top surface, a bottom surface, and a lateral surface connecting the top surface and the bottom surface; and a plurality of insulating housings respectively covering the plurality of metallic frames such that the top surface of the first conductive frame and the top surface of the second conductive frame being partially sealed so as to form a sealed region and a mounting region;

two first triangular-shaped slots concavely formed in the sealed region on the top surface of the first conductive frame, each of the two first triangular-shaped slots having a triangular-shaped bottom surface parallel to the top surface of the first conductive frame; and two second triangular-shaped slots concavely formed in the sealed region on the top surface of the second conductive frame, each of the two second triangular-shaped slots having a triangular-shaped bottom surface parallel to the top surface of the second conductive frame; four first openings are formed on the lateral surface of the first conductive frame and four second openings are formed on the lateral surface of the second conductive frame;

wherein the two first triangular-shaped slots are located in a position on the top surface of the first conductive frame and are communicated with the four first openings so as to separate at least one of the plurality of first extending arms from the mounting region and the two second triangular-shaped slots are located in a position on the top surface of the second conductive frame and communicated with the four second openings so as to separate at least one of the plurality of second extending arms from the mounting region, wherein the first conductive frame and the second conductive frame of each one of the metallic frames are spaced apart from each other along a direction, one of the first extending arms extended from the first conductive frame of each one of the metallic frames is slantingly and integrally connected to one of the second extending arms extended from the second conductive frame of another one of the metallic frames to construct a slanted structure.

7. A metallic frame of an LED structure, comprising: two conductive frames including a first conductive frame and a second conductive frame, the first conductive frame and the second conductive frame being spaced apart from each other, each of the first conductive frame and the second conductive frame having a top surface, a bottom surface, and a lateral surface connecting the top surface and the bottom surface, the top surface of each of the first conductive frame and the second conductive frame being partially sealing by an insulating body so as to form a sealed region and a mounting region;

a plurality of first extending arms integrally extended from the first conductive frame; and a plurality of second extending arms integrally extended from the second conductive frame;

two first triangular-shaped slots concavely formed in the sealed region on the top surface of the first conductive frame, each of the two first triangular-shaped slots having a triangular-shaped bottom surface parallel to the top surface of the first conductive frame; and two second triangular-shaped slots concavely formed in the sealed region on the top surface of the second conductive frame, each of the two second triangular-shaped slots having a triangular-shaped bottom surface parallel to the top surface of the second conductive frame; four first openings are formed on the lateral surface of the first conductive frame and four second openings are formed on the lateral surface of the second conductive frame;

wherein the two first triangular-shaped slots are located in a position on the top surface of the first conductive frame and are communicated with the four first openings so as to separate at least one of the plurality of first extending arms from the mounting region and the two second triangular-shaped slots are located in a position on the top surface of the second conductive frame and communicated with the four second openings so as to separate at least one of the plurality of second extending arms from the mounting region.

8. The metallic frame of the LED structure according to claim 7, wherein two of the four first openings formed on the first conductive frame and two of the four second openings formed on the second conductive frame are arranged in a symmetrical manner.

9. The metallic frame of the LED structure according to claim 8, wherein two notches penetrating from the top surface to the bottom surface are formed on the lateral surface of the first conductive frame, two notches penetrating from the top surface to the bottom surface are formed on the lateral surface of the second conductive frame, the four notches are in position respectively corresponding to the other two of the four first openings formed on the first conductive frame and the other two of the four second openings formed on the second conductive frame.

10. The metallic frame of the LED structure according to claim 7, wherein the two first triangular-shaped slots and the two second triangular-shaped slots respectively formed on the first conductive frame and the second conductive frames are distributed on four corners of the metallic frame.

11. The metallic frame of the LED structure according to claim 10, wherein the four first openings comprise two first smaller openings and two first bigger openings, the four second openings comprise two second smaller openings and two second bigger openings, each of the two first smaller openings is formed at an angle of the corresponding first triangular-shaped slot, and each of the two second smaller openings is formed at an angle of the corresponding second triangular-shaped slot, and each of the two first bigger openings is formed on an opposite side of the angle of the corresponding first triangular-shaped slot, and each of the two second bigger openings is formed on an opposite side of the angle of the corresponding second triangular-shaped slot.

12. The metallic frame of the LED structure according to claim 11, wherein four notches are respectively formed on the two first smaller openings and the two second smaller openings so as to construct a plurality of pillar constructions of the insulating body respectively arranged in the notches.

13. The metallic frame of the LED structure according to claim 12, wherein a hypotenuse side of each of the two first triangular-shaped slots and the two second triangular-shaped slots formed with a curved edge is substantially arranged along a periphery of an accommodating hole of the insulating body.

14. The metallic frame of the LED structure according to claim 7, wherein the first conductive frame has a protruding portion, the second conductive frame has a notch portion in position corresponding to the protruding portion, a bottom surface of the protruding portion is formed with a trough-like construction, and a top surface of the notch portion is formed with a trough, the insulating housing filled between the first conductive frame and the second conductive frame is formed with an upper-and-lower malposition construction.

* * * * *